(12) United States Patent
Makino et al.

(10) Patent No.: US 10,813,232 B2
(45) Date of Patent: Oct. 20, 2020

(54) WIRING BOARD AND METHOD FOR MANUFACTURING THE SAME

(71) Applicant: IBIDEN CO., LTD., Ogaki (JP)

(72) Inventors: Toshihide Makino, Ogaki (JP); Hidetoshi Noguchi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 175 days.

(21) Appl. No.: 15/671,451

(22) Filed: Aug. 8, 2017

(65) Prior Publication Data
US 2018/0042124 A1 Feb. 8, 2018

(30) Foreign Application Priority Data

Aug. 8, 2016 (JP) ................................ 2016-155497

(51) Int. Cl.
| | |
|---|---|
| *H05K 3/46* | (2006.01) |
| *H05K 1/11* | (2006.01) |
| *H05K 3/42* | (2006.01) |
| *H05K 1/16* | (2006.01) |
| *H05K 3/20* | (2006.01) |

(Continued)

(52) U.S. Cl.
CPC .......... *H05K 3/4652* (2013.01); *H05K 1/111* (2013.01); *H05K 1/116* (2013.01); *H05K 1/16* (2013.01); *H05K 3/202* (2013.01); *H05K 3/429* (2013.01); *H05K 3/4602* (2013.01); *H05K 3/4655* (2013.01); *H05K 1/0366* (2013.01); *H05K 1/11* (2013.01); *H05K 1/115* (2013.01);
(Continued)

(58) Field of Classification Search
CPC .......... H05K 1/11; H05K 1/111; H05K 1/115; H05K 1/116; H05K 1/0366; H05K 3/202; H05K 3/429; H05K 3/4602; H05K 3/4655; H05K 3/4652; H05K 3/4658; H05K 3/4661; H05K 3/4682; H05K 2201/096; H05K 2201/09009
See application file for complete search history.

(56) References Cited

U.S. PATENT DOCUMENTS

| | | | | |
|---|---|---|---|---|
| 2010/0246140 A1* | 9/2010 | Nakasato | .............. | H01L 21/486 361/728 |
| 2010/0282502 A1* | 11/2010 | Kato | ................. | H01L 23/49822 174/260 |

(Continued)

FOREIGN PATENT DOCUMENTS

JP 2016-015433 A 1/2016

*Primary Examiner* — Paresh H Paghadal
(74) *Attorney, Agent, or Firm* — Oblon, McClelland, Maier & Neustadt, L.L.P.

(57) ABSTRACT

A wiring board includes core substrate, a first build-up layer on first surface of the substrate and including conductive and insulating resin layers, and a second build-up layer on second surface of the substrate and including conductive and insulating resin layers. The first build-up is formed such that each conductive layer includes a metal foil layer and a plating layer on the foil layer and the foil layer of a conductive layer on an outermost resin layer has thickness greater than thickness of the foil layer of each conductive layer on a non-outermost resin layer, and the second build-up is formed such that each conductive layer includes a metal foil layer and a plating layer on the foil layer and the foil layer of a conductive layer on an outermost resin layer has thickness greater than thickness of the foil layer of each conductive layer on a non-outermost resin layer.

20 Claims, 13 Drawing Sheets

(51) Int. Cl.
*H05K 1/03* (2006.01)
*H05K 3/06* (2006.01)

(52) U.S. Cl.
CPC ....... *H05K 3/061* (2013.01); *H05K 2201/096* (2013.01); *H05K 2201/09009* (2013.01)

(56) References Cited

U.S. PATENT DOCUMENTS

| | | | | |
|---|---|---|---|---|
| 2011/0240351 | A1* | 10/2011 | Wakita | H05K 3/4644 174/258 |
| 2013/0075140 | A1* | 3/2013 | Amano | H05K 3/4602 174/257 |
| 2015/0179560 | A1* | 6/2015 | Arisaka | H05K 1/0366 257/777 |
| 2015/0245473 | A1* | 8/2015 | Shimizu | H05K 1/0298 257/778 |
| 2016/0066423 | A1* | 3/2016 | Sakamoto | H05K 1/02 174/261 |

* cited by examiner

WIRING BOARD AND METHOD FOR MANUFACTURING THE SAME

CROSS-REFERENCE TO RELATED APPLICATIONS

The present application is based upon and claims the benefit of priority to Japanese Patent Application No. 2016-155497, filed Aug. 8, 2016, the entire contents of which are incorporated herein by reference.

BACKGROUND OF THE INVENTION

Field of the Invention

The present invention relates to a wiring board in which multiple conductive layers and multiple insulating resin layers are alternately laminated on front and back sides of a core substrate, and relates to a method for manufacturing the wiring board.

Description of Background Art

Japanese Patent Laid-Open Publication No. 2016-015433 describes a wiring board in which an electronic component is mounted on a conductive layer on an outermost insulating resin layer. The entire contents of this publication are incorporated herein by reference.

SUMMARY OF THE INVENTION

According to one aspect of the present invention, a wiring board includes a core substrate, a first build-up layer formed on a first surface of the core substrate and including conductive layers and insulating resin layers, and a second build-up layer formed on a second surface of the core substrate on the opposite side with respect to the first surface and including conductive layers and insulating resin layers. The first build-up layer is formed such that each of the conductive layers includes a metal foil layer and a plating layer formed on the metal foil layer and that the metal foil layer of a conductive layer formed on an outermost insulating resin layer has a thickness that is greater than a thickness of the metal foil layer of each conductive layer formed on a non-outermost insulating resin layer, and the second build-up layer is formed such that each of the conductive layers includes a metal foil layer and a plating layer formed on the metal foil layer and that the metal foil layer of a conductive layer formed on an outermost insulating resin layer has a thickness that is greater than a thickness of the metal foil layer of each conductive layer formed on a non-outermost insulating resin layer.

According to another aspect of the present invention, a method for manufacturing a wiring board includes forming on a first surface of a core substrate such that first build-up layer includes conductive layers and insulating resin layers laminated alternately, and forming on a second surface of the core substrate on the opposite side with respect to the first surface such that second build-up layer includes conductive layers and insulating resin layers laminated alternately. The forming of the first build-up layer includes forming each of the conductive layers including a metal foil layer and a plating layer on the metal foil layer such that the metal foil layer of a conductive layer formed on an outermost insulating resin layer has a thickness that is greater than a thickness of the metal foil layer of each conductive layer formed on a non-outermost insulating resin layer, and the forming of the second build-up layer includes forming each of the conductive layers including a metal foil layer and a plating layer on the metal foil layer such that the metal foil layer of a conductive layer formed on an outermost insulating resin layer has a thickness that is greater than a thickness of the metal foil layer of each conductive layer formed on a non-outermost insulating resin layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
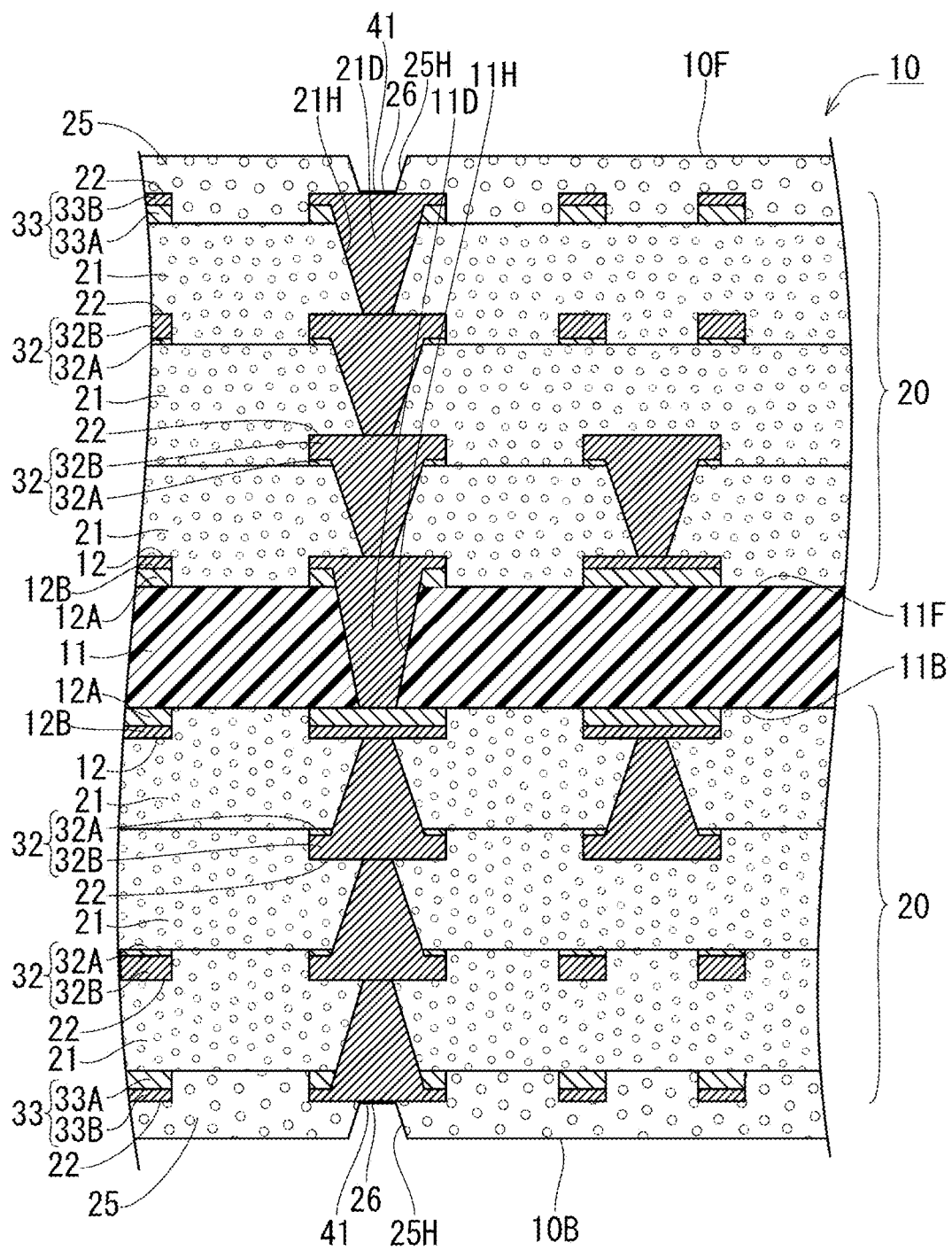
FIG. 1 is a cross-sectional side view of a wiring board according to an embodiment of the present invention.

Embodiments will now be described with reference to the accompanying drawings, wherein like reference numerals designate corresponding or identical elements throughout the various drawings.

First Embodiment

In the following, a first embodiment of the present invention is described with reference to FIG. 1-11. As illustrated in FIG. 1, in a wiring board 10 of the present embodiment, build-up layers (20, 20) are respectively laminated on front and back surfaces of a core substrate 11. In this specification, an "upper" side refers to an upper side in a lamination direction of each of build-up layers (20, 20) with a core substrate 11 as a reference. That is, for an F surface (11F), which is a front side surface of the core substrate 11, the "upper" side is an upper side in FIG. 1; and for a B surface (11B), which is a back side surface of the core substrate 11, the "upper" side is a lower side in FIG. 1. The core substrate 11 is formed of an insulating member, and core conductive layers 12 are respectively formed on the front and the back surfaces of the core substrate 11. The core substrate 11 has a thickness of 30-60 μm.

The build-up layer 20 on the F surface (11F) side of the core substrate 11, and the build-up layer 20 on the B surface (11B side of the core substrate 11, are each formed by alternately laminating three insulating resin layers 21 and three build-up conductive layers 22 from the core substrate 11 side. Hereinafter, as appropriate, a build-up conductive layer 22 on an outermost insulating resin layer 21 is referred to as an outermost conductive layer 33, and a build-up conductive layer 22 on a non-outermost insulating resin layer 21 is referred to as a non-outermost conductive layer 32.

The insulating resin layers 21 are each, for example, a prepreg (a resin sheet obtained by impregnating a core material with a resin). Further, the insulating resin layers 21 each have a thickness of 30-60 μm, which is substantially the same as the thickness of the core substrate 11.

Multiple via holes (11H, 21H) are formed in the core substrate 11 and the insulating resin layers 21. The via holes (11H, 21H) are filled with plating and multiple via conductors (11D, 21D) (corresponding to "filled vias" of the present invention) are formed. Due to these via conductors (11D, 21D), two conductive layers sandwiching the core substrate 11 or an insulating resin layer 21 (that is, the two core conductive layers 12, a core conductive layer 12 and a build-up conductive layer 22, or two build-up conductive layers 22) are connected to each other. Further, the via holes (21H) formed in the insulating resin layers 21 each have a tapered shape that is gradually reduced in diameter toward the core substrate 11, and the via holes (11H) Banned in the core substrate 11 each have a tapered shape that is gradually reduced in diameter from the F surface (11F) toward the B surface (11B).

Solder resist layers (25, 25) are respectively laminated on the outermost build-up conductive layers (22, 22) (outermost conductive layers (33, 33)) of the build-up layers (20, 20) on front and back sides of the core substrate 11. Multiple pad holes (25H, 25H) are formed in the solder resist layers (25, 25). Of the outermost build-up conductive layers (22, 22), portions exposed from the pad holes (25H, 25H) become pads (26, 26).

In wiring board 10 of the present embodiment, all of the core conductive layers 12 and the build-up conductive layers 22 each have a two-layer structure that includes a copper foil layer (12A, 32A, or 33A) (corresponding to a "metal foil layer" of the present invention) formed on the core substrate 11 or an insulating resin layer 21, and a plating layer (12B, 32B, or 33B) formed on the copper foil layer. The copper foil layer (33A) of an outermost conductive layer 33 has a thickness of about 7-10 μm, whereas the copper foil layer (32A) of a non-outermost conductive layer 32 has a thickness of about 1-5 μm. The copper foil layer (33A) of an outermost conductive layer 33 is thicker than the copper foil layer (32A) of a non-outermost conductive layer 32. The thickness of the copper foil layer (33A) of an outermost conductive layer 33 is 2 or more times the thickness of the copper foil layer (32A) of a non-outermost conductive layer 32. The copper foil layer (12A) of a core conductive layer 12 preferably has substantially the same thickness as the copper foil layer (33A) of an outermost conductive layer 33. Further, the conductive layers (12, 32, 33) each have substantially the same total thickness, which is 10-20 μm.

Figure 2A:
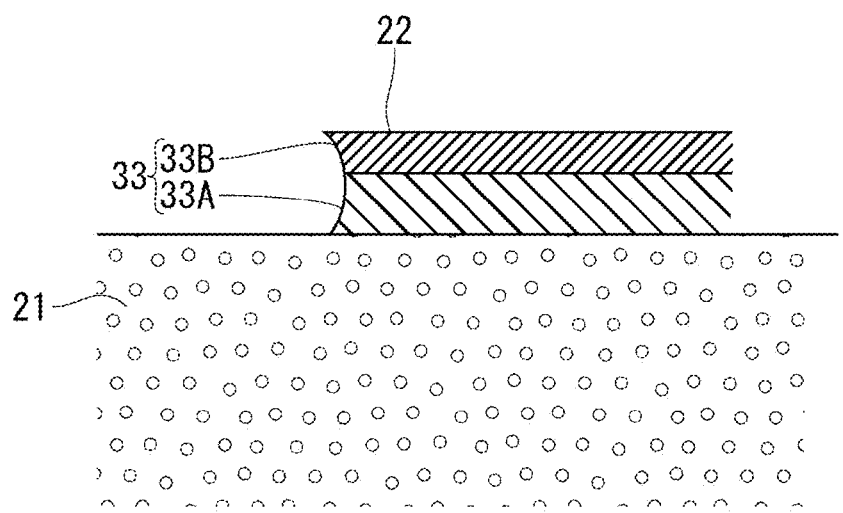
FIG. 2A is an enlarged cross-sectional side view of a portion around an outermost conductive layer.
Figure 2B:
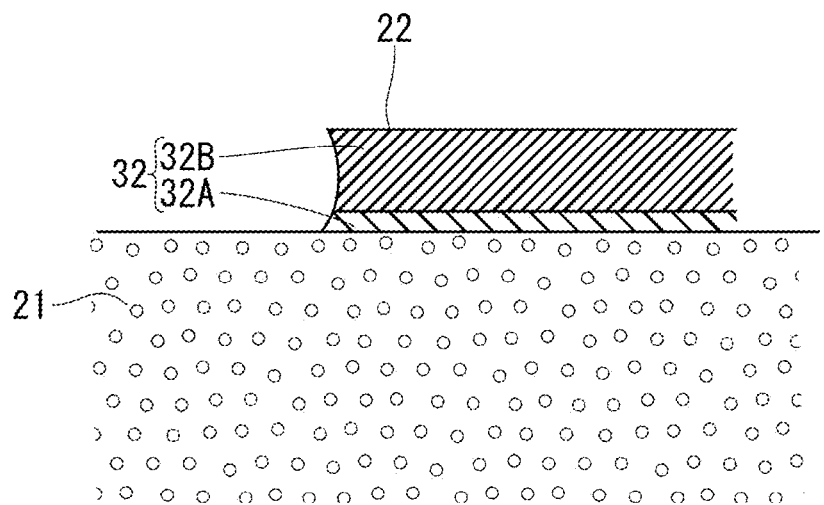
FIG. 2B is an enlarged cross-sectional side view of a portion around a non-outermost conductive layer.

As illustrated in FIGS. 2A and 2B, side surfaces of wiring patterns in the conductive layers (12, 32, 33) are recessed. A maximum depth of the side surfaces of the wiring patterns in the outermost conductive layers 33 and the core conductive layers 12 is 10-20% of the thickness of each of the conductive layers (12, 33), whereas a maximum depth of the side surfaces of the wiring patterns in the non-outermost conductive layers 32 is 10% or less of the thickness of each of the conductive layers 32. The side surfaces of the wiring patterns of the outermost conductive layers 33 and the core conductive layers 12 are more recessed than the side surfaces of the wiring patterns in the non-outermost conductive layers 32. The side surfaces of the wiring patterns in the conductive layers (12, 32, 33) are etching surfaces formed by etching.

Next, a method for manufacturing the wiring board 10 of the present embodiment is described.

Figure 3A:
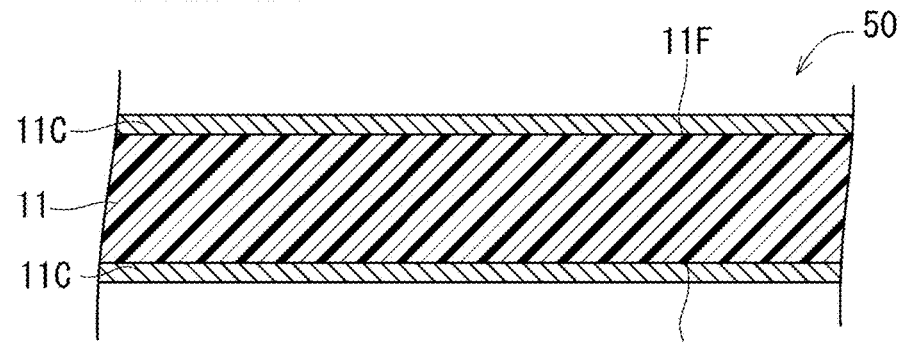
FIG. 3A-3D are cross-sectional side views illustrating manufacturing processes of the wiring board.

(1) As illustrated in FIG. 3A, a core base material 50 is prepared that is obtained by laminating a copper foil (11C) on both front and back surfaces of the core substrate 11 that is formed of an epoxy resin or a BT (bismaleimide triazine) resin and a reinforcing material such as a glass cloth. The core base material 50 is conveyed, for example, using belt conveyor or the like.

Figure 3B:
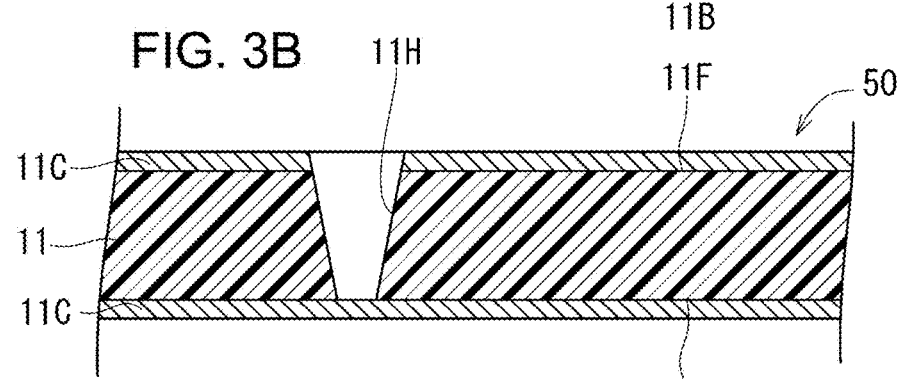

(2) As illustrated in FIG. 3B, the via holes (11H) each penetrating the copper foil (11C) on the F surface (11F) side and the core substrate 11 are formed by irradiating, for example, $CO_2$ laser to the core base material 50 from the F surface (11F) side.

(3) An electroless plating treatment is performed. An electroless plating film (not illustrated in the drawings) is formed on the copper foil (11C) and in the via holes (11H).

Figure 3C:
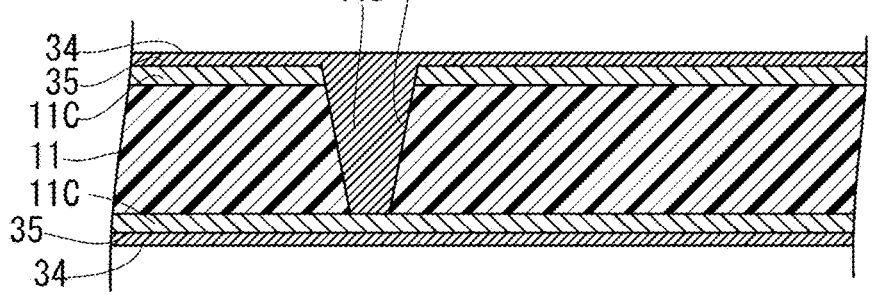

(4) An electrolytic plating treatment. As illustrated in FIG. 3C, the via holes (11H) are filled with electrolytic plating and the via conductors (11D) are formed, and an electrolytic plating film 35 is formed on the electroless plating film on the copper foil (11C). Hereinafter, the copper foil (11C), the electroless plating film and the electrolytic plating film 35 are collectively referred to as a conductor film 34.

Figure 3D:
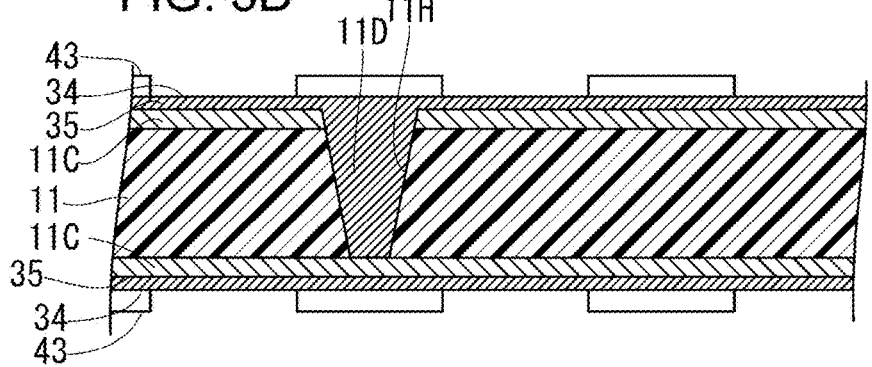

(5) As illustrated in FIG. 3D, an etching resist 43 of a predetermined pattern is formed on the conductor film 34.

Figure 4A:
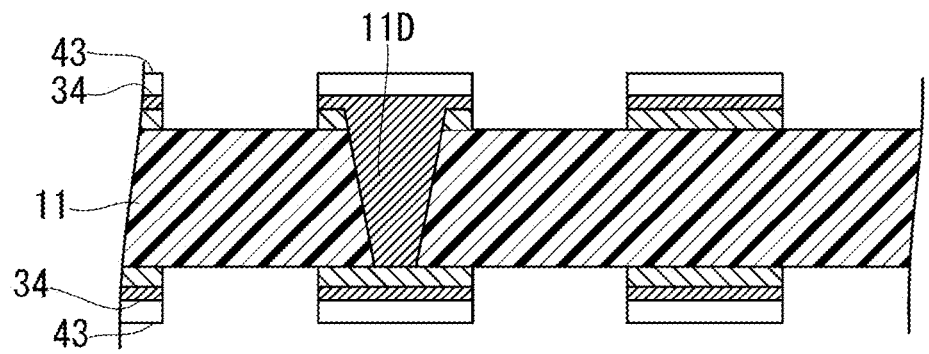
FIG. 4A-4C are cross-sectional side views illustrating manufacturing processes of the wiring board.

(6) Etching is performed. As illustrated in FIG. 4A, of the conductor film 34, a portion exposed from the etching resist 43 is removed.

Figure 4B:
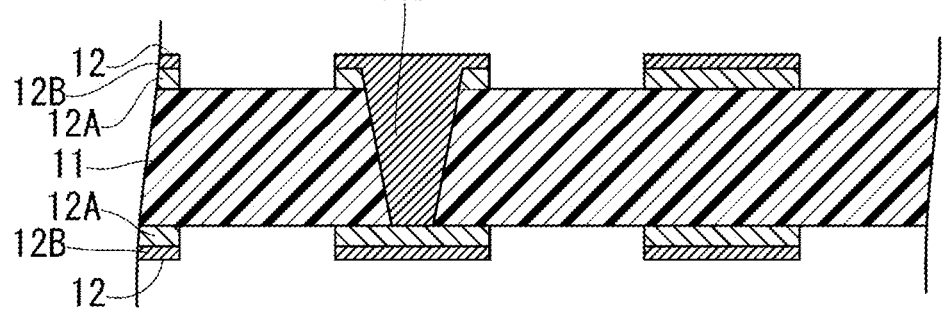

(7) The etching resist 43 is peeled off. As illustrated in FIG. 4B, the core conductive layers 12 are each formed by the remaining conductor film 34. As a result, a state is achieved in which the core conductive layers (12, 12) on the front and back sides of the core substrate 11 are connected to each other by the via conductors (11D). Of each of the core conductive layers 12, the above-described plating layer (12B) is formed from the remaining portions of the electroless plating film and the electrolytic plating film 35.

Figure 4C:
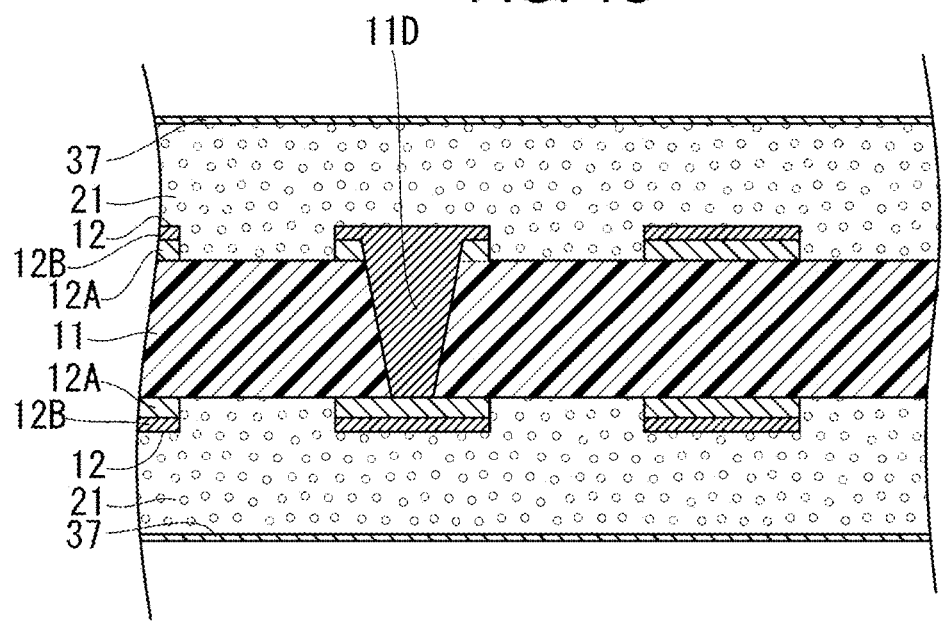

(8) As illustrated in FIG. 4C, on the core conductive layer 12 on each of the front and back surfaces of the core substrate 11, a prepreg as an insulating resin layer 21 and a thin copper foil 37 that is thinner than the copper foil (11C) are laminated, and then, the resulting substrate is hot-pressed. In this case, spaces between portions of the core conductive layer 12 are filled with the prepreg.

Figure 5A:
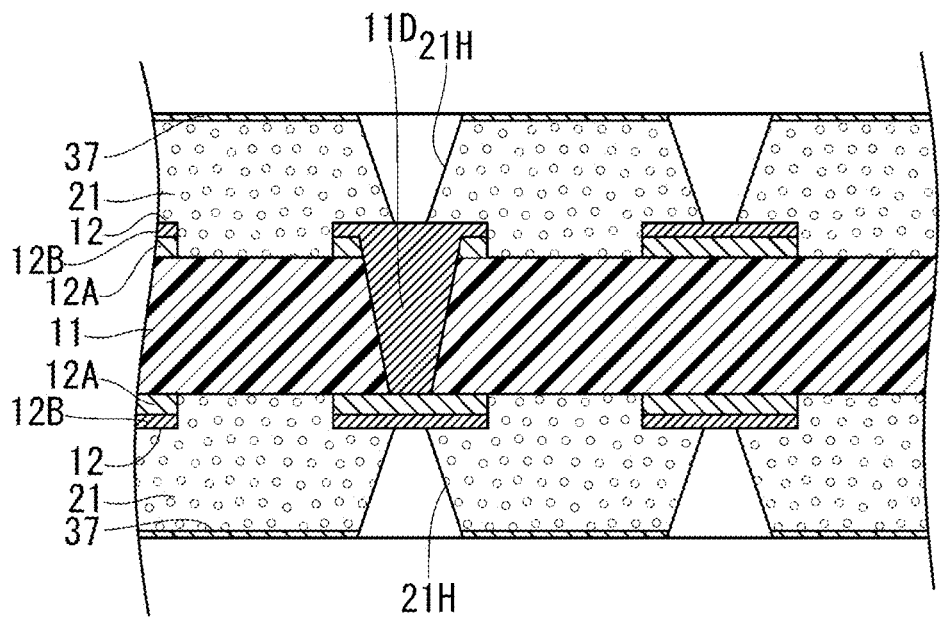
FIGS. 5A and 5B are cross-sectional side views illustrating manufacturing processes of the wiring board.

(9) As illustrated in FIG. 5A, the multiple via holes (21H, 21H) are formed by irradiating $CO_2$ laser to the insulating resin layers (21, 21) on the front and back sides of the core substrate 11, the insulating resin layers (21, 21) being each formed from a prepreg.

(10) An electroless plating treatment is performed. An electroless plating film (not illustrated in the drawings) is formed on the interlayer insulating layers (21, 21) and in the via holes (21H, 21H).

Figure 5B:
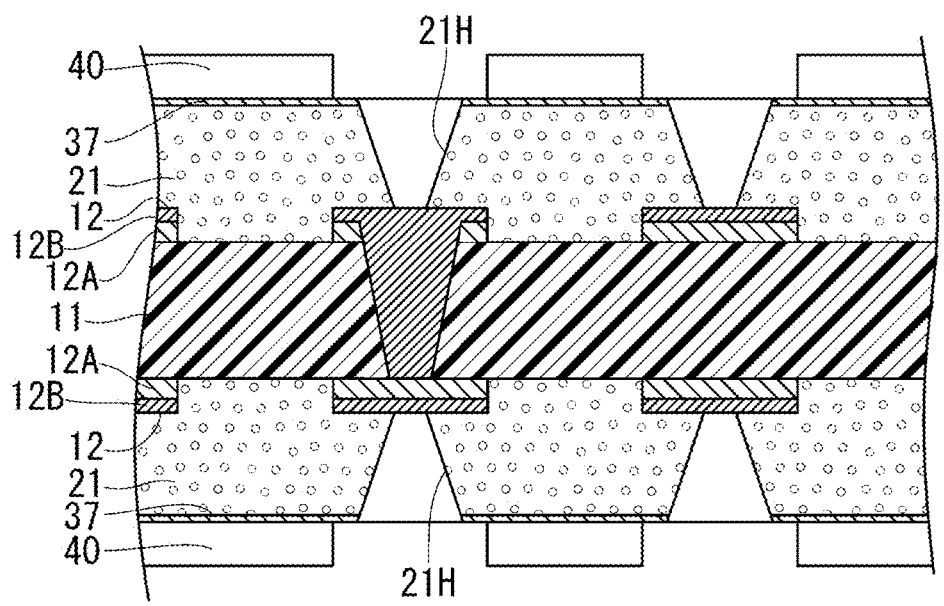

(11) As illustrated in FIG. 5B, a plating resist 40 of a predetermined pattern is formed on the electroless plating film on the thin copper foil 37.

Figure 6A:
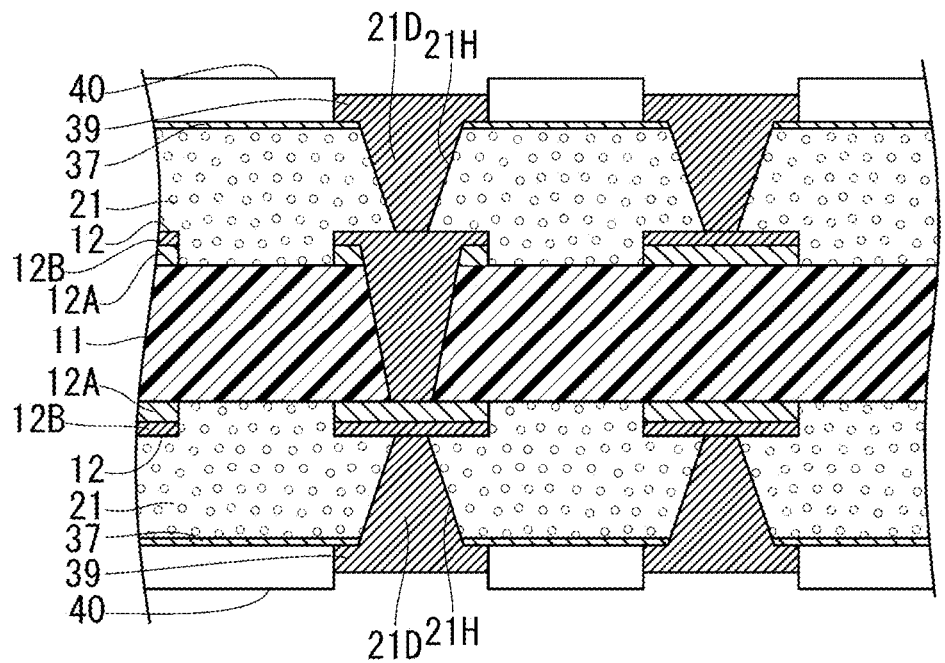
FIGS. 6A and 6B are cross-sectional side views illustrating manufacturing processes of the wiring board.

(12) An electrolytic plating treatment is performed. As illustrated in FIG. 6A, the via holes (21H, 21H) are filled with plating and the via conductors (21D, 21D) are formed. Further, electrolytic plating films (39, 39) are formed on portions of the electroless plating film (not illustrated in the drawings) on the thin copper foils (37, 37), the portions being exposed from the plating resist 40.

Figure 6B:
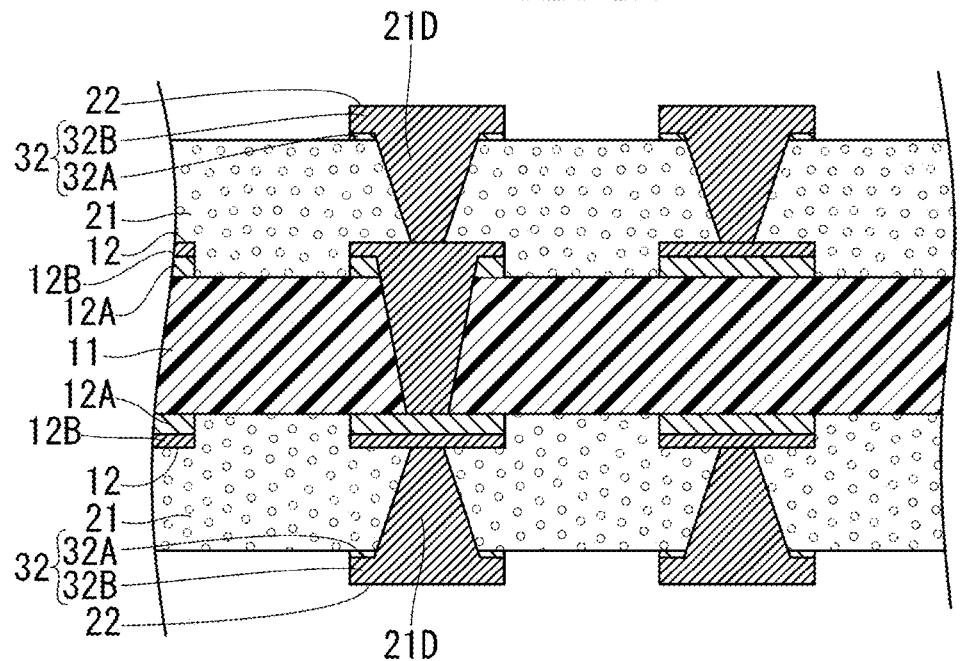

(13) The plating resist 40 is peeled off and the electroless plating film (not illustrated in the drawings) and the copper foil 37, which are below the plating resist 40, are removed. As illustrated in FIG. 6B, one build-up conductive layer 22 as a non-outermost conductive layer 32 is formed on each insulating resin layer 21 on the front and back sides of the core substrate 11 by the remaining electrolytic plating film 39, electroless plating film and thin copper foil 37. On each of the front and back sides of the core substrate 11, a portion of the build-up conductive layer 22 and the core conductive layer 12 are connected by the via conductors (21D). Of each of the build-up conductive layers 22, the above-described plating layer (32B) is formed from the remaining portions of the electroless plating film and the electrolytic plating film 39.

Figure 7:
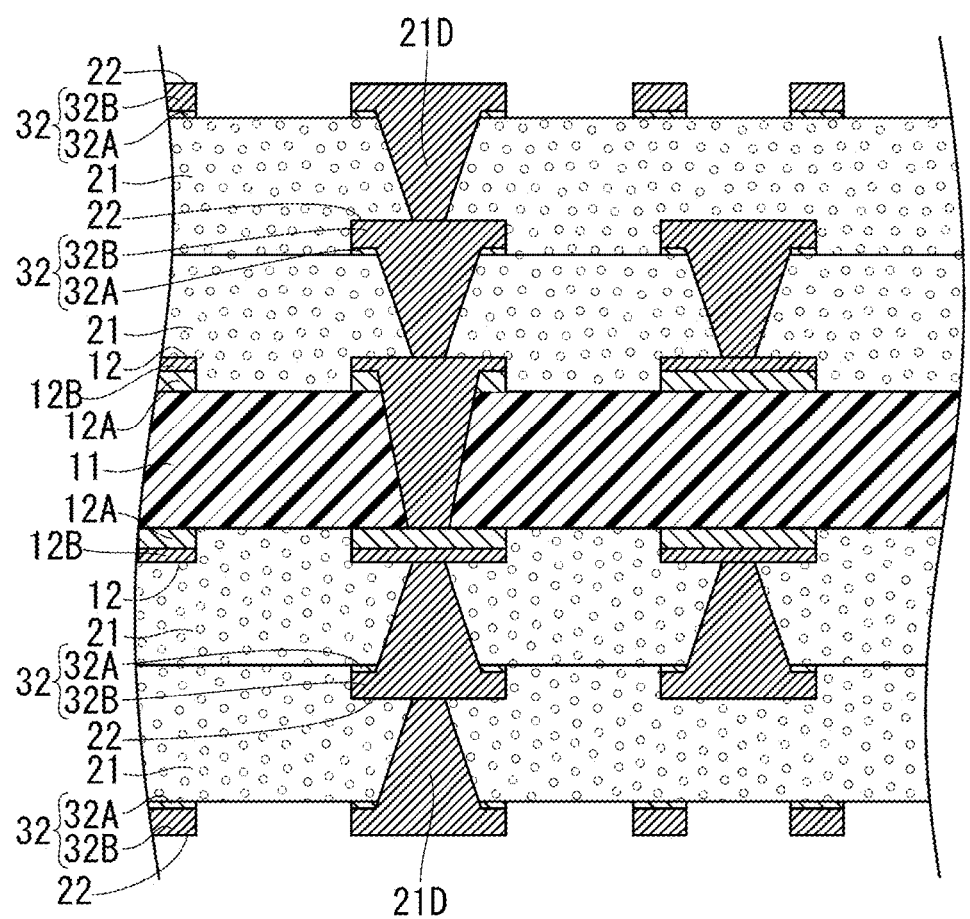
FIG. 7 is a cross-sectional side view illustrating a manufacturing process of the wiring board.

(14) By the same processing as described in the above (8)-(13), as illustrated in FIG. 7, on each of the front and back sides of the core substrate 11, one insulating resin layer 21 and one build-up conductive layer 22 are further formed and a state is achieved in which the build-up conductive layers 22 are connected to each other by the via conductors (21D).

Figure 8:
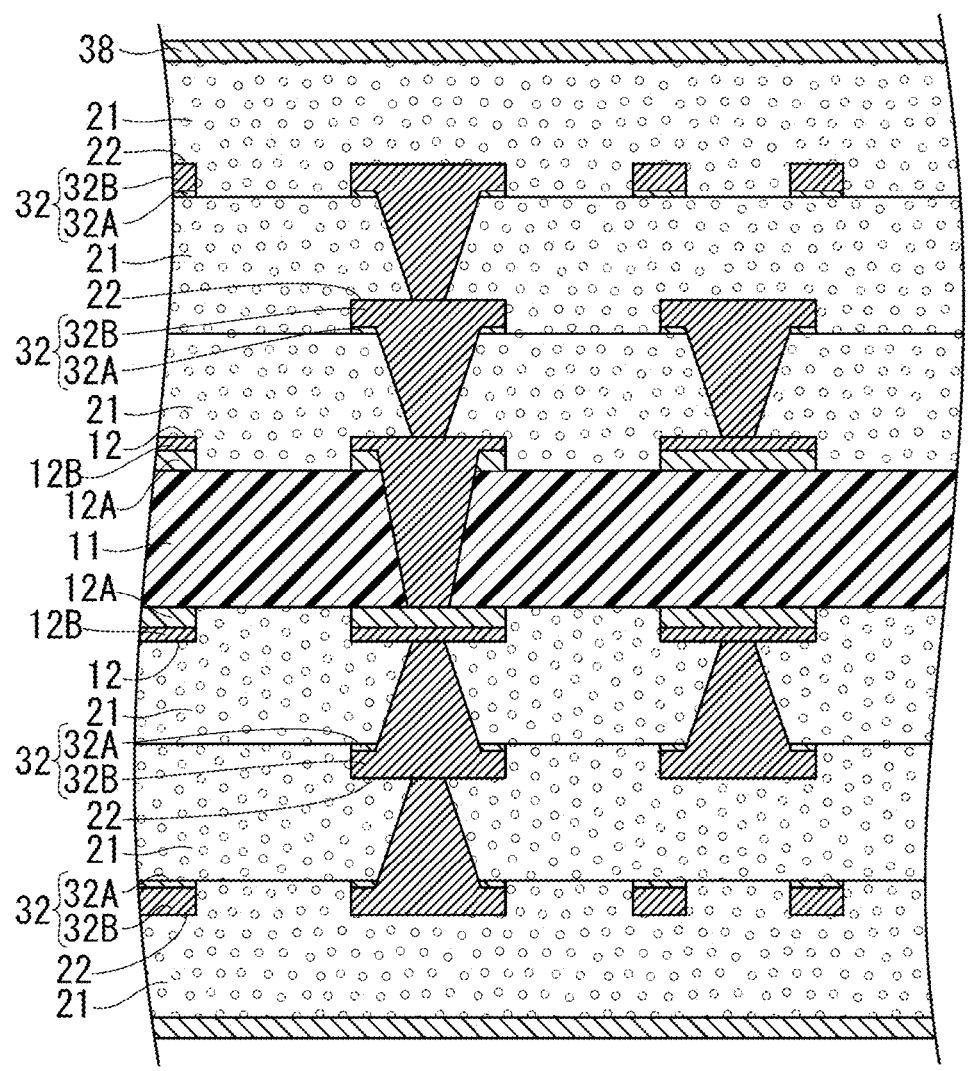
FIG. 8 is a cross-sectional side view illustrating a manufacturing process of the wiring board.

(15) As illustrated in FIG. 8, on each of the outermost insulating resin layers (21, 21) on the front and back sides of the core substrate 11, a prepreg as an insulating resin layer 21 and a thick copper foil 38 having the same thickness as the copper foil (11C) are laminated, and the resulting substrate is hot-pressed. In this case, spaces between portions of the build-up conductive layer 22 below the insulating resin layer 21 are filled with the prepreg.

Figure 9:
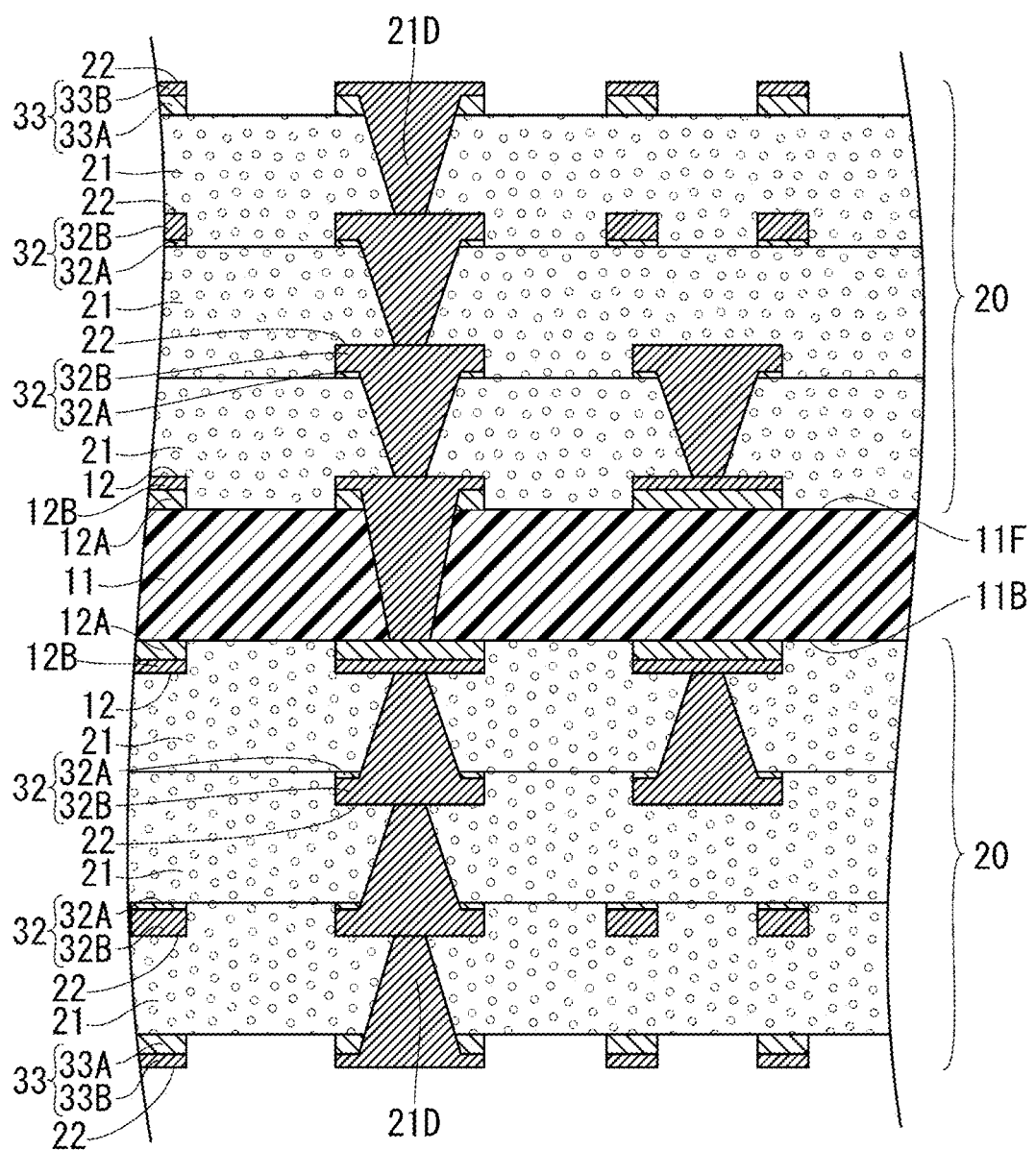
FIG. 9 is a cross-sectional side view illustrating a manufacturing process of the wiring board.

(16) By the same processing as described in the above (2)-(7), as illustrated in FIG. 9, on each of the front and back sides of the core substrate 11, a build-up conductive layer 22 as an outermost conductive layer 33 is formed and a state is achieved in which this build-up conductive layer 22 and the lower build-up conductive layer 22 as a non-outermost conductive layer 32 are connected to each other by the via conductors (21D).

Figure 10:
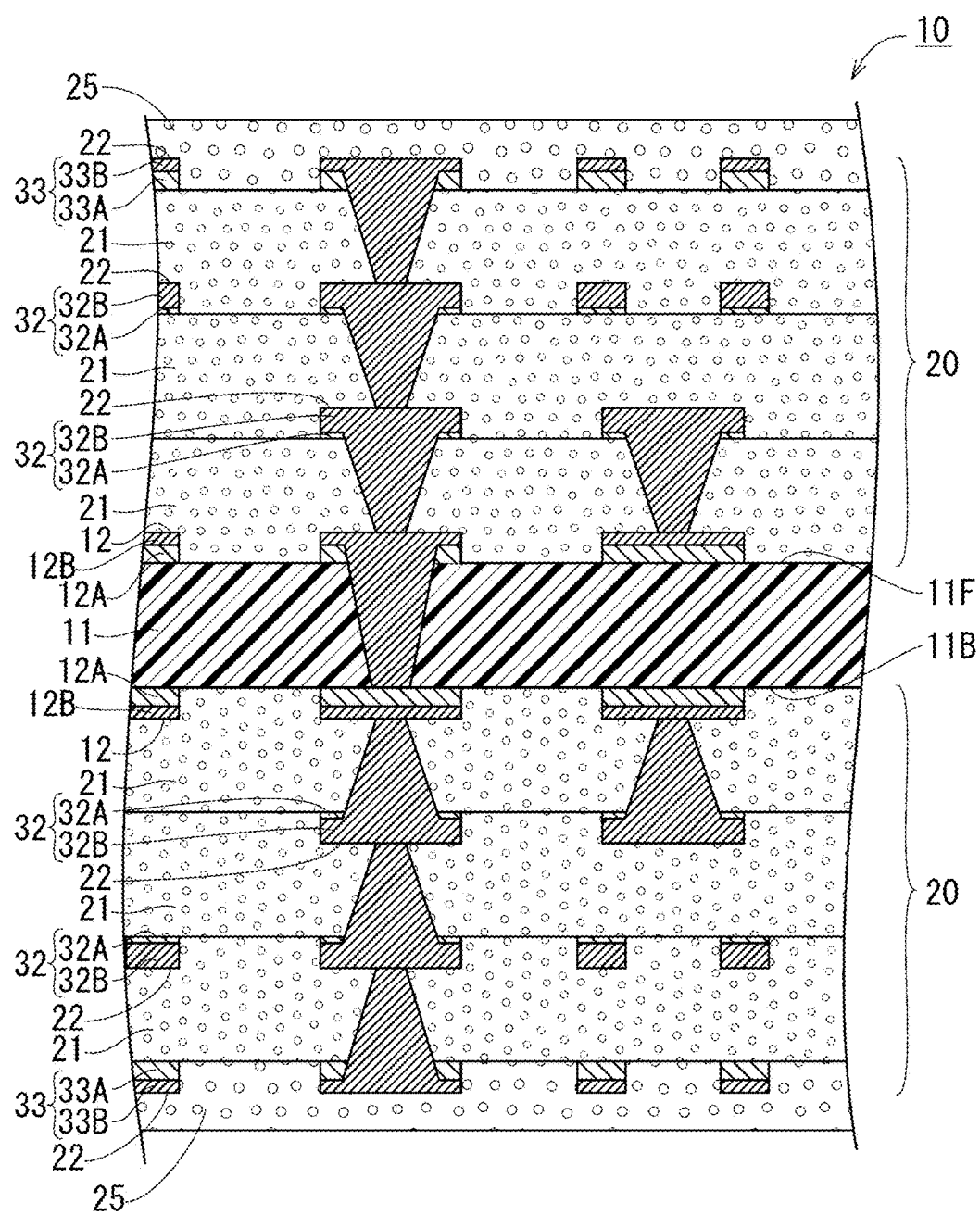
FIG. 10 is a cross-sectional side view illustrating a manufacturing process of the wiring board.

(17) As illustrated in FIG. 10, on each of the front and back sides of the core substrate 11, the solder resist layer 25 is laminated on the outermost conductive layer 33.

Figure 11:
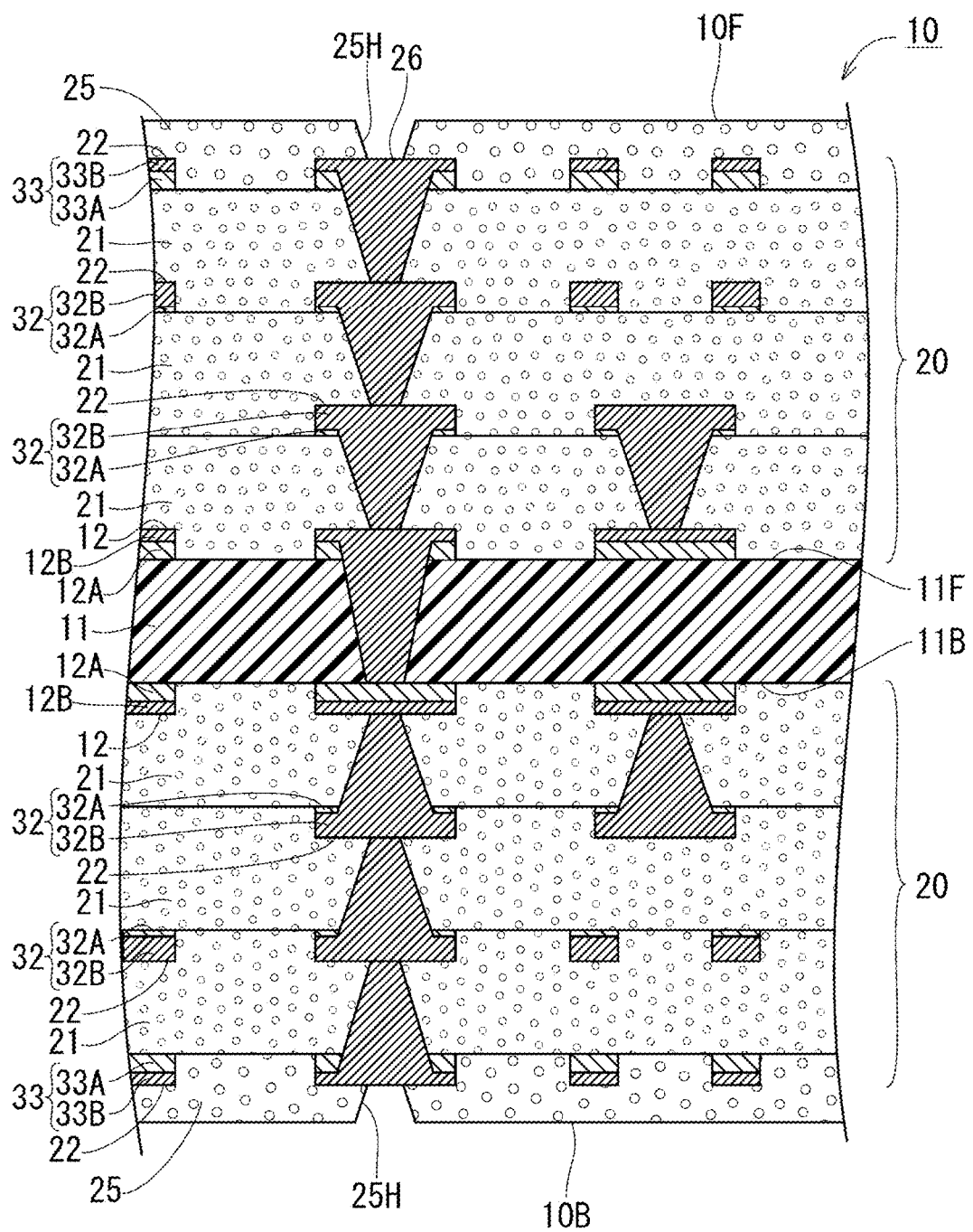
FIG. 11 is a cross-sectional side view illustrating a manufacturing process of the wiring board.

(18) As illustrated in FIG. 11, on each of the front and back sides of the core substrate 11, the tapered pad holes (25H) are formed at predetermined places in the solder resist layer 25; and, of the outermost conductive layer 33, portions exposed from the pad holes become the pads 26.

(19) On each of the pads 26, a nickel layer, a palladium layer and a gold layer are laminated in this order and a metal film 41 illustrated in FIG. 1 is formed. As a result, the wiring board 10 is completed. Instead of the metal film 41, it is also possible to perform surface treatment using OSP (preflux).

The above-described method for forming the core conductive layers 12 of the core substrate 11 and the outermost conductive layers 33 is referred to as a subtractive method, and the method for forming the non-outermost conductive layers 32 is referred to as a modified semi-additive method. Further, side surfaces of wiring patterns of the core conductive layers 12 and the outermost conductive layers 33 (which are formed using the subtractive method in which there are many portions removed by etching, that is, etching time is long) are more recessed than side surfaces of wiring patterns of the non-outermost conductive layers 32.

The description about the structure and the manufacturing method of the wiring board 10 of the present embodiment is as given above. Next, an example of use and an operation effect of the wiring board 10 are described. The wiring board 10 of the present embodiment is used by forming solder bumps on the pads 26 and mounting and soldering an electronic component such as a CPU on the solder bumps (on an F surface (10F) side).

However, when an outermost build-up conductive layer 22 (outermost conductive layer 33) has an uneven thickness or has an extremely thin portion, reliability of the connection between the outermost build-up conductive layer 22 and the electronic component is likely to decrease, that is, mountability of the electronic component is likely to decrease. In contrast, in the wiring board 10 of the present embodiment, the copper foil layer (33A) of an outermost conductive layer 33 is thicker than the copper foil layer (32A) of a non-outermost conductive layer 32, and a sufficient thickness of an outermost conductive layer 33 is ensured to some extent. Therefore, reliability of the connection between an outermost conductive layer 33 and an electronic component can be improved and mountability of the electronic component can be improved.

Further, the proportion of the copper foil layer (32A or 33A) in a conductive layer (32 or 33) is larger in an outermost conductive layer 33 than in a non-outermost conductive layer 32. Therefore, flatness of an outermost conductive layer 33 is improved, and mountability of an electronic component is improved. Further, since a thicker copper foil can have a larger anchor effect on an insulating resin layer 21 below the copper foil, a peel strength between the copper foil layer (33A) of the outermost conductive layer 33, on which the electronic component is mounted, and the outermost insulating resin layer 21 is improved.

Further, a relatively thick copper foil is used in the subtractive method in which a conductive layer is formed by etching, and a relatively thin copper foil is used in the modified semi-additive method in which a conductive layer is formed by plating. Therefore, by forming the outermost conductive layers 33 using the subtractive method and forming the non-outermost conductive layers 32 using the modified semi-additive method, the copper foil layer (33A) of each of the outermost conductive layers 33 and the copper foil layer (32A) of each of the non-outermost conductive layers 32 can be easily formed to have different thicknesses.

Here, it is also possible to form all of the build-up conductive layers 22 using the subtractive method. However, a conductive layer formed using the modified semi-additive method can have a denser (finer) wiring patterns than a conductive layer formed using the subtractive method. Therefore, by forming the outermost conductive layers 33 using the subtractive method and forming the non-outermost conductive layers 32 using the modified semi-additive method, a dense (fine) wiring pattern can be formed while mountability of the electronic component is improved. Further, by forming a dense (fine) wiring pattern, the number of conductive layers can be reduced and thus the wiring board 10 can be reduced in thickness.

Further, in the present embodiment, the core conductive layers 12 are also formed using the subtractive method and the copper foil layers (12A) of the core conductive layers 12 are relatively thick. As a result, the core base material 50 is thick as compared to a case where the core conductive layers 12 are formed using the modified semi-additive method, and thus, during a manufacturing process, the core base material 50 is easy to be conveyed.

Other Embodiments

The present invention is not limited to the above-described embodiments. For example, the embodiments described below are also included in the technical scope of the present invention. Further, in addition to the embodiments described below, the present invention can also be embodied in various modified forms within the scope without departing from the spirit of the present invention.

(1) In the above embodiment, two non-outermost conductive layers 32 are provided on each of the front and back sides of the core substrate. However, it is also possible that one or three or more non-outermost conductive layers 32 are provided on each of the front and back sides of the core substrate.

Figure 12:
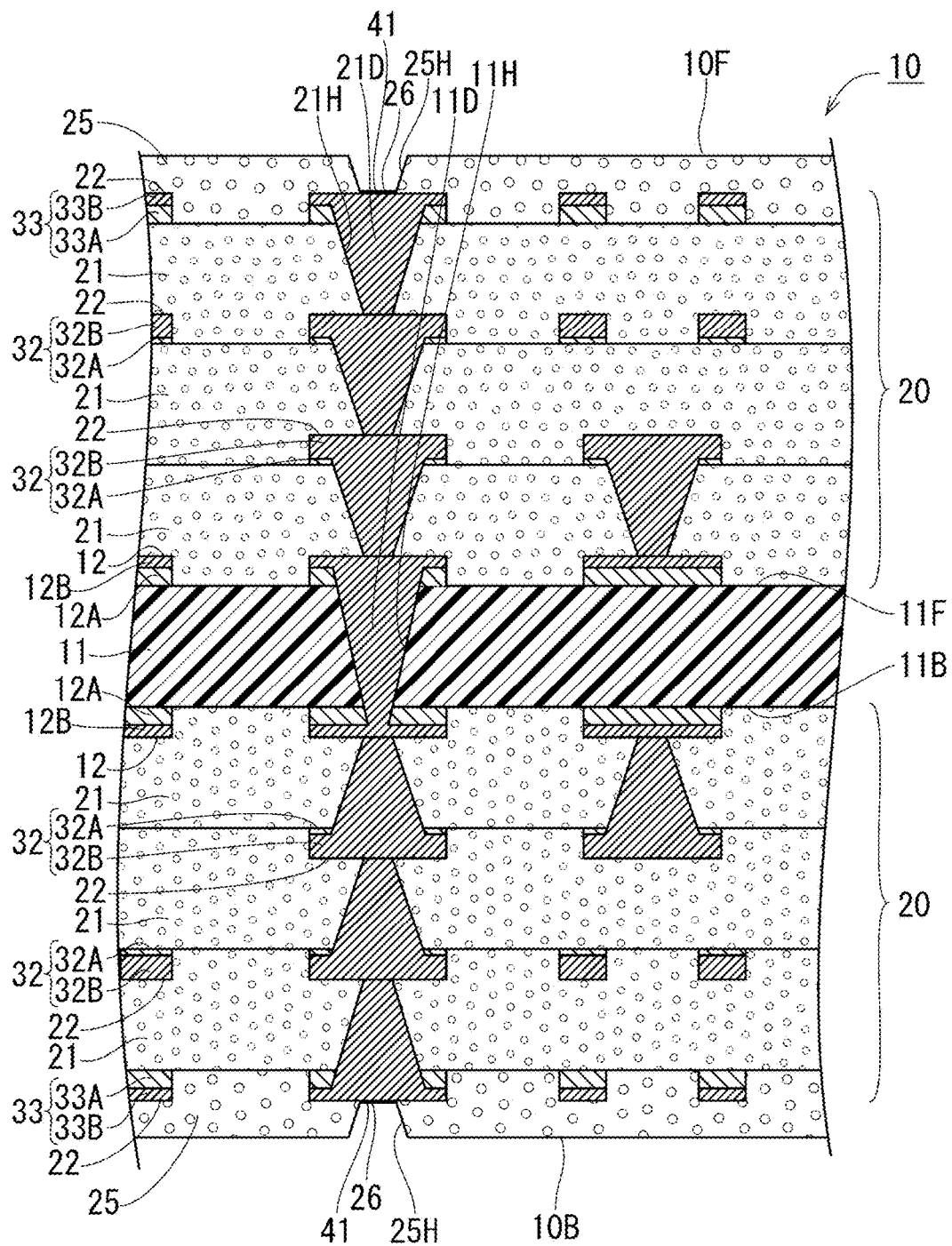
FIG. 12 is a cross-sectional side view of a wiring board according to a modified embodiment.
Figure 13:
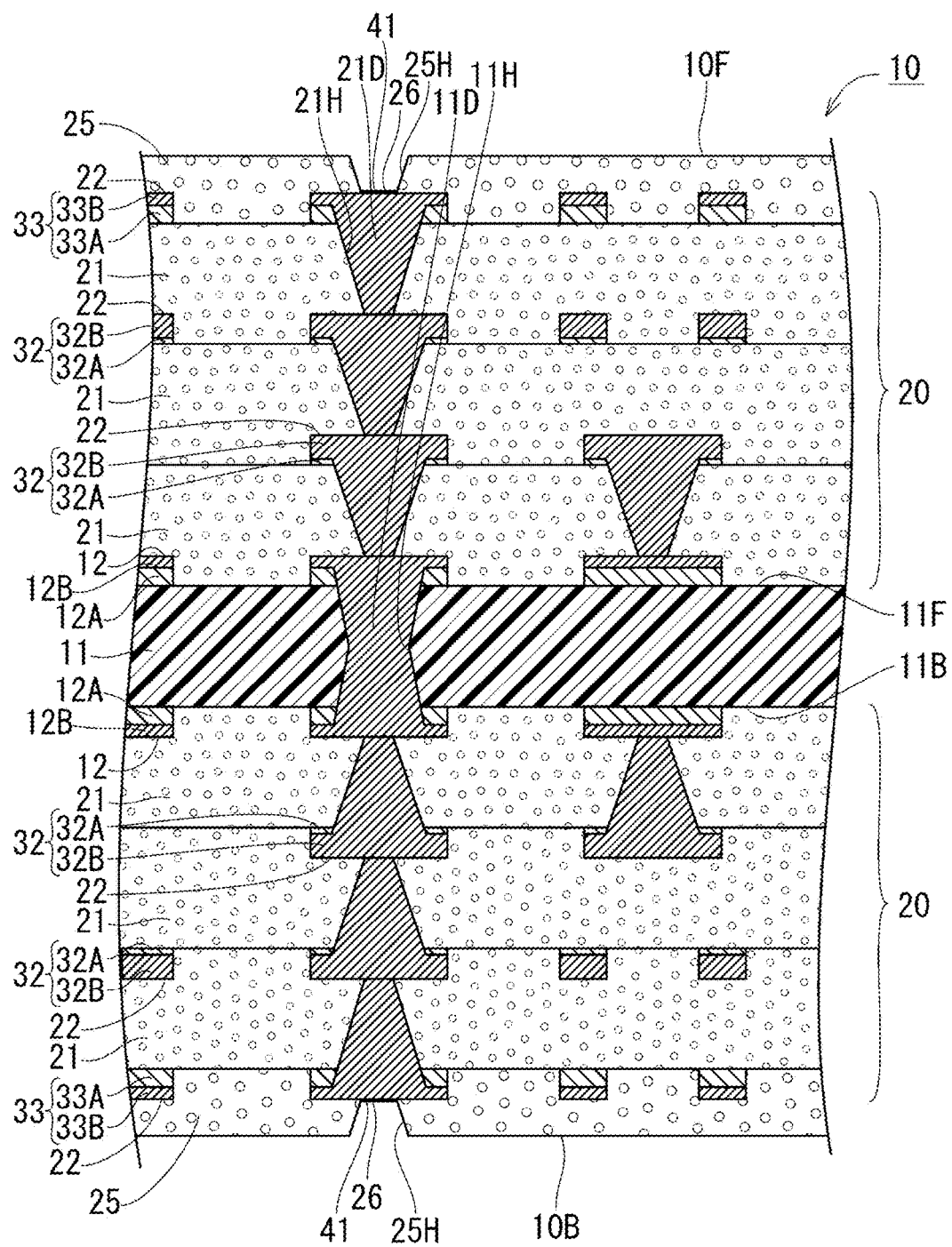
FIG. 13 is a cross-sectional side view of a wiring board according to a modified embodiment.

(2) In the above embodiment, the via conductors (11D) penetrate the copper foil (11C) on the F surface (11F) side and the core substrate 11, but do not penetrate the copper foil (11C) on the B surface (11B) side. However, as illustrated in FIGS. 12 and 13, it is also possible that the via conductors (11D) penetrate the copper foil (11C) on the B surface (11B) side. In this case, as illustrated in FIGS. 12 and 13, it is also possible that the via conductors (11D) each have a shape that is gradually reduced in diameter from the F surface (11F) toward the B surface (11B), or that the via conductors (11D) each have a middle-constricted shape that is gradually reduced in diameter from both the F surface (11F) and the B surface (11B) toward a deep side and in which small diameter side ends of two tapered halves are communicatively connected.

(3) In the above embodiment, the "metal foil" of the present invention is a copper foil. However, without being limited to this, for example, it is also possible that the metal foil is a nickel foil, a titanium foil, or the like.

(4) In the above embodiment, all of the conductive layers (12, 32, 33) have substantially the same thickness. However, for example, it is also possible that each of the core conductive layers 12 and the outermost conductive layers 33 is thicker than each of the non-outermost conductive layers 32, or vice versa.

(5) In the above embodiment, all of the insulating resin layers 21 have the same thickness. However, for example, it is also possible that each of the outermost insulating resin layers 21 is thicker than each of the non-outermost insulating resin layers 21, or vice versa.

(6) In the above embodiment, the thickness of each of the insulating resin layers 21 is substantially the same as the thickness of the core substrate 12. However, it is also possible that the thickness of each of the insulating resin layers 21 is different from the thickness of the core substrate 12.

In a wiring board, improvement in mountability of an electronic component is desired.

A wiring board according to an embodiment of the present invention is formed by alternately laminating multiple conductive layers and multiple insulating resin layers on both front and back surfaces of a core substrate, the conductive layers being each formed by laminating a plating layer on a metal foil layer. The metal foil layer of a conductive layer on an outermost insulating resin layer is thicker than the metal foil layer of a conductive layer on a non-outermost insulating resin layer.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring board, comprising:

a core substrate;

a first build-up layer formed on a first surface of the core substrate and comprising a plurality of conductive layers and a plurality of insulating resin layers; and a second build-up layer formed on a second surface of the core substrate on an opposite side with respect to the first surface and comprising a plurality of conductive layers and a plurality of insulating resin layers, wherein the first build-up layer is formed such that each of the conductive layers comprises a metal foil layer and a plating layer formed on the metal foil layer and that the metal foil layer of a conductive layer formed directly on an outermost insulating resin layer and the metal foil layer of a conductive layer formed directly on the first surface of the core substrate have thicknesses that are greater than a thickness of the metal foil layer of at least one conductive layer formed directly on a non-outermost insulating resin layer, the second build-up layer is formed such that each of the conductive layers comprises a metal foil layer and a plating layer formed on the metal foil layer and that the metal foil layer of a conductive layer formed directly on an outermost insulating resin layer and the metal foil layer of a conductive layer formed directly on the second surface of the core substrate have thicknesses that are greater than a thickness of the metal foil layer of at least one conductive layer formed directly on a non-outermost insulating resin layer, the first build-up layer is formed such that each of the conductive layers has a wiring pattern having a recessed side surface and that the recessed side surface of the wiring pattern of the conductive layer formed directly on the outermost insulating resin layer has a greatest depth that is greater than a greatest depth of the recessed side surface of the wiring pattern of each conductive layer formed directly on the non-outermost insulating resin layer, the second build-up layer is formed such that each of the conductive layers has a wiring pattern having a recessed side surface and that the recessed side surface of the wiring pattern of the conductive layer formed directly on the outermost insulating resin layer has a greatest depth that is greater than a greatest depth of the recessed side surface of the wiring pattern of each conductive layer formed directly on the non-outermost insulating resin layer, the first build-up layer is formed such that the greatest depth of the recessed side surface of the wiring pattern of the conductive layer formed directly on the outermost insulating resin layer is in a range of 10% to 20% of the thickness of the conductive layer formed on the outermost insulating resin layer and that the greatest depth of the recessed side surface of the wiring pattern of each conductive layer formed directly on the non-outermost insulating resin layer is 10% or less of the thickness of each conductive layer formed on the non-outermost insulating resin layer, and the second build-up layer is formed such that the greatest depth of the recessed side surface of the wiring pattern of the conductive layer formed directly on the outermost insulating resin layer is in a range of 10% to 20% of the thickness of the conductive layer formed on the outermost insulating resin layer and that the greatest depth of the recessed side surface of the wiring pattern of each conductive layer formed directly on the non-outermost insulating resin layer is 10% or less of the thickness of each conductive layer formed on the non-outermost insulating resin layer.

2. A wiring board according to claim 1, wherein the first build-up layer is formed such that the thickness of the metal foil layer of the conductive layer formed directly on the outermost insulating resin layer and the thickness of the metal foil layer of the conductive layer formed directly on the first surface of the core substrate are greater than the thickness of the metal foil layer of each conductive layer formed directly on another non-outermost insulating resin layer, and the second build-up layer is formed such that the thickness of the metal foil layer of the conductive layer formed directly on the outermost insulating resin layer and the thickness of the metal foil layer of the conductive layer formed directly on the second surface of the core substrate are greater than the thickness of the metal foil layer of each conductive layer formed directly on another non-outermost insulating resin layer.

3. The wiring board according to claim 1, wherein the first and second build-up layers are formed such that the conductive layers in the first and second build-up layers have substantially a same thickness such that the plating layer of the conductive layer formed directly on the outermost insulating resin layer has a thickness that is smaller than a thickness of the plating layer of the conductive layer of the at least one conductive layer formed directly on the non-outermost insulating resin layer.

4. The wiring board according to claim 1, wherein the first build-up layer is formed such that the metal foil layer of the conductive layer formed directly on the outermost insulating resin layer has the thickness that is twice or more the thickness of the metal foil layer of each conductive layer formed directly on the non-outermost insulating resin layer, and the second build-up layer is formed such that the metal foil layer of the conductive layer formed directly on the outermost insulating resin layer has the thickness that is twice or more the thickness of the metal foil layer of each conductive layer formed directly on the non-outermost insulating resin layer.

5. The wiring board according to claim 1, wherein the first build-up layer is formed such that each of the conductive layers has the wiring pattern having the recessed side surface that is an etching surface, and the second build-up layer is formed such that each of the conductive layers has the wiring pattern having the recessed side surface that is an etching surface.

6. The wiring board according to claim 1, wherein the first build-up layer is formed such that each of the conductive layers has a thickness in a range of 10 µm to 20 µm, and the second build-up layer is formed such that each of the conductive layers has a thickness in a range of 10 µm to 20 µm.

7. The wiring board according to claim 1, wherein the first build-up layer is formed such that each of the insulating resin layers includes a core material, and the second build-up layer is formed such that each of the insulating resin layers includes a core material.

8. The wiring board according to claim 1, wherein the first build-up layer is formed such that each of the insulating resin layers has a thickness in a range of 30 µm to 60 µm, and the second build-up layer is formed such that each of the insulating resin layers has a thickness in a range of 30 µm to 60 µm.

9. The wiring board according to claim 1, wherein the first and second build-up layers are formed such that the insulating resin layers in the first and second build-up layers have a substantially same thickness.

10. The wiring board according to claim 9, wherein the core substrate is formed such that the core substrate has a thickness substantially same as the thickness of the insulating resin layers in the first and second build-up layers.

11. The wiring board according to claim 1, further comprising:
a plurality of filled via conductors formed in the core substrate and the first and second build-up layers such that the plurality of filled via conductors connects the conductive layers in the first and second build-up layers.

12. The wiring board according to claim 1, wherein the first build-up layer is formed such that the metal foil layer of the conductive layer formed directly on the outermost insulating resin layer has a proportion of the metal foil layer that is greater than a proportion of the metal foil layer of each conductive layer formed directly on the non-outermost insulating resin layer, and the second build-up layer is formed such that the metal foil layer of the conductive layer formed directly on the outermost insulating resin layer has a proportion of the metal foil layer that is greater than a proportion of the metal foil layer of each conductive layer formed directly on the non-outermost insulating resin layer.

13. A wiring board, comprising:
a core substrate;
a first build-up layer formed on a first surface of the core substrate and comprising a plurality of conductive layers and a plurality of insulating resin layers; and
a second build-up layer formed on a second surface of the core substrate on an opposite side with respect to the first surface and comprising a plurality of conductive layers and a plurality of insulating resin layers,
wherein the first build-up layer is formed such that each of the conductive layers comprises a metal foil layer and a plating layer formed on the metal foil layer and that the metal foil layer of a conductive layer formed directly on an outermost insulating resin layer and the metal foil layer of a conductive layer formed directly on the first surface of the core substrate have thicknesses that are greater than a thickness of the metal foil layer of at least one conductive layer formed directly on a non-outermost insulating resin layer, the second build-up layer is formed such that each of the conductive layers comprises a metal foil layer and a plating layer formed on the metal foil layer and that the metal foil layer of a conductive layer formed directly on an outermost insulating resin layer and the metal foil layer of a conductive layer formed directly on the second surface of the core substrate have thicknesses that are greater than a thickness of the metal foil layer of at least one conductive layer formed directly on a non-outermost insulating resin layer, the first and second build-up layers are formed such that the conductive layers in the first and second build-up layers have substantially a same thickness such that the plating layer of the conductive layer formed directly on the outermost insulating resin layer has a thickness that is smaller than a thickness of the plating layer of the conductive layer of the at least one conductive layer formed directly on the non-outermost insulating resin layer.

14. A wiring board according to claim 13, wherein the first build-up layer is formed such that the thickness of the metal foil layer of the conductive layer formed directly on the outermost insulating resin layer and the thickness of the metal foil layer of the conductive layer formed directly on the first surface of the core substrate are greater than the thickness of the metal foil layer of each conductive layer formed directly on another non-outermost insulating resin layer, and the second build-up layer is formed such that the thickness of the metal foil layer of the conductive layer formed directly on the outermost insulating resin layer and the thickness of the metal foil layer of the conductive layer formed directly on the second surface of the core substrate are greater than the thickness of the metal foil layer of each conductive layer formed directly on another non-outermost insulating resin layer.

15. The wiring board according to claim 13, wherein the first build-up layer is formed such that the metal foil layer of the conductive layer formed directly on the outermost insulating resin layer has the thickness that is twice or more the thickness of the metal foil layer of each conductive layer formed directly on the non-outermost insulating resin layer, and the second build-up layer is formed such that the metal foil layer of the conductive layer formed directly on the outermost insulating resin layer has the thickness that is twice or more the thickness of the metal foil layer of each conductive layer formed directly on the non-outermost insulating resin layer.

16. The wiring board according to claim 13, wherein the first build-up layer is formed such that each of the insulating resin layers includes a core material, and the second build-up layer is formed such that each of the insulating resin layers includes a core material.

17. The wiring board according to claim 13, wherein the first and second build-up layers are formed such that the insulating resin layers in the first and second build-up layers have a substantially same thickness.

18. The wiring board according to claim 17, wherein the core substrate is formed such that the core substrate has a thickness substantially same as the thickness of the insulating resin layers in the first and second build-up layers.

19. The wiring board according to claim 13, further comprising:
a plurality of filled via conductors formed in the core substrate and the first and second build-up layers such that the plurality of filled via conductors connects the conductive layers in the first and second build-up layers.

20. The wiring board according to claim 13, wherein the first build-up layer is formed such that the metal foil layer of the conductive layer formed directly on the outermost insulating resin layer has a proportion of the metal foil layer that is greater than a proportion of the metal foil layer of each conductive layer formed directly on the non-outermost insulating resin layer, and the second build-up layer is formed such that the metal foil layer of the conductive layer formed directly on the outermost insulating resin layer has a proportion of the metal foil layer that is greater than a proportion of the metal foil layer of each conductive layer formed directly on the non-outermost insulating resin layer.

* * * * *